United States Patent
Zhang et al.

(10) Patent No.: US 6,744,314 B2
(45) Date of Patent: Jun. 1, 2004

(54) WIDEBAND POWER AMPLIFIER LINEARIZATION TECHNIQUE

(75) Inventors: Guang Fei Zhang, St. Laurent (CA); Xing Wang, Dollard-des-Ormeaux (CA); Fabio Concilio, Dollard-des-Ormeaux (CA); Tjo San Jao, Beaconsfield (CA)

(73) Assignee: Harris Corporation, Melbourne, FL (US)

( * ) Notice: Subject to any disclaimer, the term of this patent is extended or adjusted under 35 U.S.C. 154(b) by 20 days.

(21) Appl. No.: 10/174,968

(22) Filed: Jun. 20, 2002

(65) Prior Publication Data

US 2003/0234687 A1 Dec. 25, 2003

(51) Int. Cl.[7] .................................................. H03F 1/26
(52) U.S. Cl. ........................................ 330/149; 330/151
(58) Field of Search .............................. 330/124 R, 149, 330/151

(56) References Cited

U.S. PATENT DOCUMENTS 6,066,983 A * 5/2000 Okoro ........................ 330/149
6,292,055 B1 * 9/2001 Chabas ....................... 330/149
6,326,845 B1 * 12/2001 Miyaji et al. ................ 330/151

* cited by examiner

Primary Examiner—Steven J. Mottola
(74) Attorney, Agent, or Firm—Duane Morris LLP

(57) ABSTRACT

A novel linearization apparatus for reducing power amplifier distortion does not require delay lines. The apparatus includes a power amplifier and an error generator. The signals provided by the error generator (error signal) and the power amplifier are combined to subtract out the distortion introduced by the power amplifier. The error generator includes two auxiliary amplifiers, wherein one of the auxiliary amplifiers is operated in it saturated region and the other is operated in its non-saturated region. The power amplifier and the two auxiliary amplifiers have the same distortion characteristics and receive the same input signal. The auxiliary amplifier operating in its saturated region introduces distortion and the auxiliary amplifier operating in its non-saturated region does not introduce distortion. The two signals provided by the auxiliary amplifiers are combined to produce an error signal having a distortion component that is an approximate replica of the power amplifier distortion.

19 Claims, 3 Drawing Sheets

WIDEBAND POWER AMPLIFIER LINEARIZATION TECHNIQUE

BACKGROUND

The present invention is generally related to electronic amplifiers, and more specifically to a novel linearization technique applicable to power amplifiers.

Radio frequency (RF) and microwave radios are in common use today. As the number of users increases and the amount of information to be conveyed increases, there is an ever present demand to increase capacity with less available spectrum bandwidth. An obstacle to meeting this demand is distortion introduced into the transmitted signal by the power amplification stage of the radio. For example, one technique used to transmit more data within a given bandwidth is to increase the modulation level. However, unless the transmission path is linear for this increased level of modulation, distortion will be introduced into the transmitted signal. Attempts to reduce distortion have implemented feed forward linearization circuitry to improve the linearity of the power amplifier. A typical feed forward linearization circuit attempts to subtract out distortion by combining a signal having distortion with another signal having a delayed version of the distortion. Typically, this is accomplished by subtracting samples of the input signal from the output signal to produce a sample of the power amplifier's distortion, and subtracting the amplified sampled distortion from a delayed signal to reduce the distortion in the output signal. The delayed signals are typically created by delay lines in the circuit. However, these delay lines impose restrictions on the bandwidth and the efficiency of the amplifier. An improved linearization scheme is desired.

In one embodiment, an apparatus for reducing amplifier distortion includes an amplifying portion, an error generator portion, and a combining portion. The amplifying portion is configured to receive an input signal or a replica signal, which is an approximate replica of the input signal. The amplifying portion is also configured to provide an amplifier signal comprising an amplifier distortion component. The error generator portion is configured to receive the input signal or the replica signal and provide an error signal comprising an error signal distortion component, which is an approximate replica of the amplifier distortion component. The combining portion is configured to subtract the error signal from the amplifier signal.

In another embodiment a method for reducing amplifier distortion includes amplifying an input signal or an approximate replica of the input signal for generating a first signal comprising an amplifier distortion component. The method also includes amplifying the input signal or the approximate replica of the input signal for generating a second signal comprising an approximate replica of the amplifier distortion component. The method further includes amplifying the input signal or the approximate replica of the input signal for generating an approximately distortionless third signal. Also include are combining the second and third signals for generating a fourth signal indicative of a difference between the second and third signals, and combining the first and fourth signals for subtracting the amplifier distortion component from the first signal.

In yet another embodiment, an amplifier circuit includes a first amplifier electromagnetically coupled to an input terminal and a first coupler. The first coupler is electromagnetically coupled to an output terminal. A second amplifier is electromagnetically coupled to the input terminal and a second coupler. A third amplifier is electromagnetically coupled to the input terminal and the second coupler, and the second coupler is electromagnetically coupled to the first coupler.

DETAILED DESCRIPTION

A novel linearization apparatus as described herein reduces distortion generated by a power amplifier by utilizing a circuit that does not utilize delay lines. In one embodiment, the apparatus amplifies a selected input signal using an amplifier configured as a power amplifier (also referred to as a main amplifier herein). During operation, the power amplifier introduces a distortion component into the signal. Thus the signal provided by the power amplifier includes two components. One component includes an amplified version of the selected input signal, and the other component includes the distortion introduced by the power amplifier. The apparatus also amplifies the selected input signal by a pair of amplifiers configured as small signal amplifiers (also referred to as auxiliary amplifiers herein). The small signal amplifiers are configured in parallel. The small signal amplifiers may also possess less power handling capability than the main amplifier, for example 20 dBm less. The small signal amplifiers have approximately the same distortion characteristics as the power amplifier. This is accomplished in one embodiment, by fabricating the power and small signal amplifiers from the same integrated circuit. One of the small signal amplifiers (referred to as the linear amplifier) is configured to operate in a linear region of operation, and the other small signal amplifier (referred to as the nonlinear amplifier) is configured to operate in a nonlinear region, e.g., saturation region, of operation. The linear amplifier produces a signal having an amplified version of the selected input signal and minimal (if any) distortion. The nonlinear amplifier produces a signal having an amplified version of the selected input signal and a distortion component. The distortion component produced by the nonlinear amplifier is an approximate replica (possibly differing in amplitude) of the distortion component produced by the power amplifier. The two distortion components are approximate replicas because the amplifiers have the same distortion components and are processing similar signals. The signals produced by the two small signal amplifiers are combined to subtract out the amplified version of the selected input signal. The resultant error signal includes only the distortion component. This error signal is subtracted from the signal produced by the power amplifier to produce an approximately distortionless signal having the amplified version of the selected input signal and a minimal, or no, distortion component.

Figure 1:
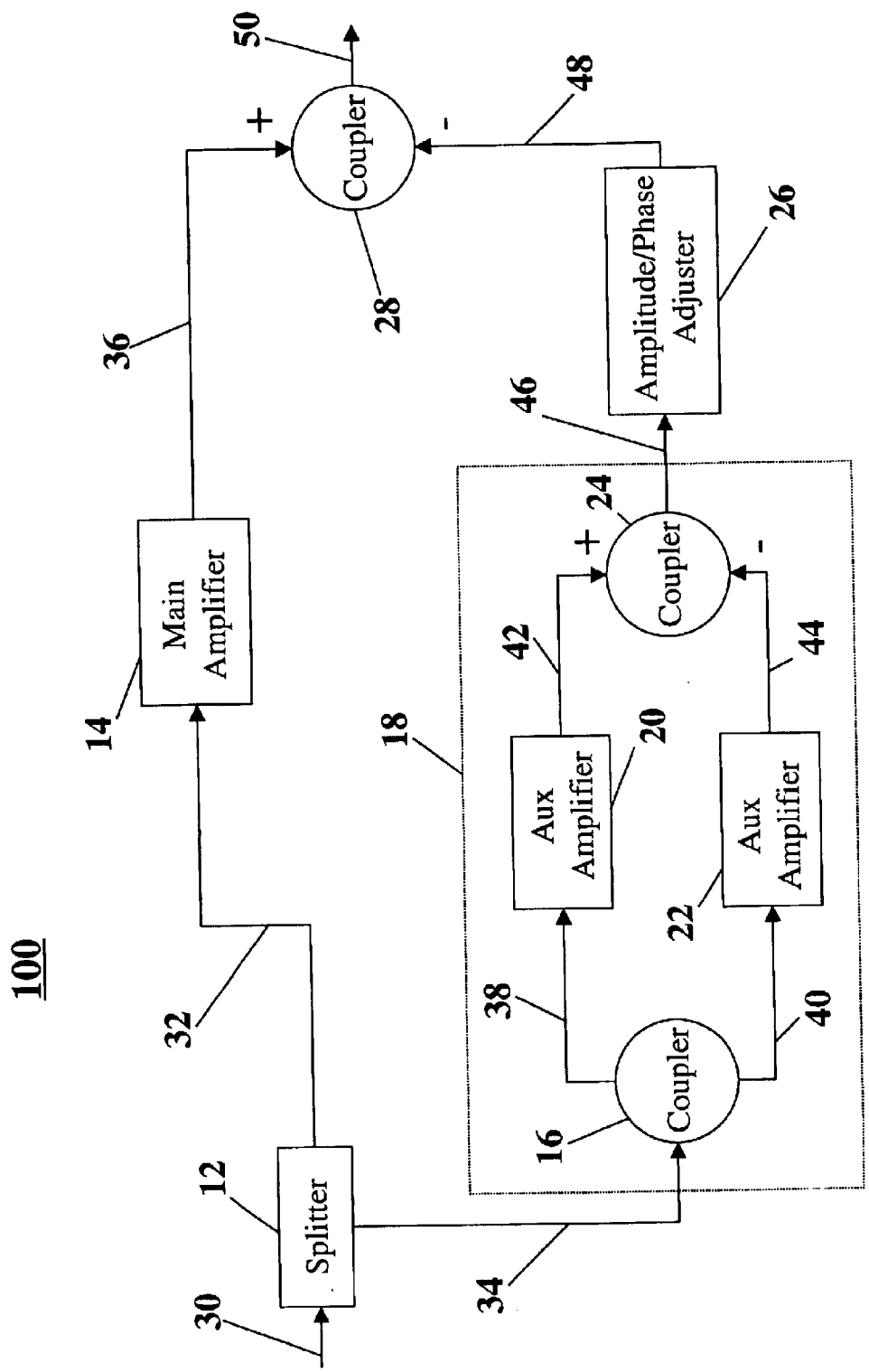
FIG. 1 is a functional block diagram of a linearization apparatus in accordance with the present invention.

Referring now to FIG. 1, there is shown a functional block diagram of a linearization apparatus 100 in accordance with the present invention. The apparatus 100 comprises optional splitter 12 configured to receive an input signal 30. The optional splitter 12 is coupled to the main amplifier 14 and the error generator portion 18. The splitter 12 generates at least one replica signal, 32 and 34, wherein each replica signal is an approximate replica of the input signal 30. The splitter 12 is optional and it is to be understood that other configurations for receiving input signal 30 are envisioned. For example, the input signal 30 may be directly provided to the main amplifier 14 and the error generator portion 18. Alternatively, the input signal 30 may be directly provided to either the main amplifier 14 or the error generator portion 18, and the splitter 12 provides a replica signal to the other of the main amplifier 14 or the error generator portion 18.

The main power amplifier 14 is configured as a power amplifier for amplifying the input signal 30 or the replica signal 32. As shown in FIG. 1, the main (power) amplifier 14 provides signal 36 responsive to signal 32. Signal 36 contains an amplified version of the signal received by the main amplifier 14, e.g., the signal 32, and a distortion component generated by the main amplifier 14. The signal 36 is provided to the coupler 28.

The error generator portion 18 comprises optional coupler 16, auxiliary amplifier 20, auxiliary amplifier 22, and coupler 24. The optional coupler 16 functions as a splitter to produce at least one replica signal, 38 and 40, wherein each of the replica signals, 38 and 40, is an approximate replica of the signal received by the coupler 16, e.g. the signal 34. As a reminder, it is reiterated that the signal 34 may be the input signal 30 or a replica of the input signal 30. The coupler 16 is optional and it is to be understood that other configurations for providing signals 38 and 40 to auxiliary amplifiers 20 and 22, respectively, are envisioned. For example, the signal 34 may be directly provided to each of the auxiliary amplifier 20 and 22. Alternatively, the signal 34 may be directly provided to either the auxiliary amplifier 20 or the auxiliary amplifier 22, and the coupler 16 provides a replica signal to the other of the auxiliary amplifier 20 or the auxiliary amplifier 22. Regardless of the configuration, each of signals 38 and 40 contains a signal component comprising either the input signal 30 or an approximate replica of the input signal 30.

Each of the amplifiers 20, 22, and 14 has the same distortion characteristics. For example, if each of the amplifiers 20, 22, and 14 is configured to operate identically, and each of the amplifiers 20, 22, and 14 receives the same signal, the signal produced by each amplifier 20, 22, and 14 contains a respective distortion component, wherein the respective distortion components are replicas of each other. Each of the amplifiers 20 and 22 is configured to function as a small signal amplifier, and not as a power amplifier. Functioning as small signal amplifiers, amplifiers 20 and 22 may be selectively and controllably configured to operate in either a saturated (nonlinear) region or a non-saturated (linear) region. The amplifier operating in the linear region (linear amplifier) produces a signal having minimal (if any) distortion. The amplifier operating in the nonlinear region (nonlinear amplifier) produces a signal having a distortion component. The distortion component produced by the nonlinear amplifier is an approximate replica (possibly differing in amplitude) of the distortion component produced by the power amplifier.

In one embodiment, one of the auxiliary amplifiers 20 and 22 functions as a linear amplifier and the other auxiliary amplifier (20 and 22) functions as a nonlinear amplifier. For example, as shown in FIG. 1, auxiliary amplifier 20 is configured to function as a nonlinear amplifier, and auxiliary amplifier 22 is configured to function as a linear amplifier. Accordingly, the signal 42 provided by the nonlinear amplifier 20 contains a signal component comprising an amplified version of the signal 38 and a distortion component generated by the nonlinear operation of the amplifier 20. Concurrently, the auxiliary amplifier 22 is configured to function as a linear amplifier. The signal 44 provided by the linear amplifier 22 contains an amplified version of the signal 40, and essentially minimal, or no, distortion. The signals 42 and 44 produced by the two small signal amplifiers 20 and 22, respectively, are combined by coupler 24 to subtract out the amplified version of the selected input signal and produce an error signal 46. The coupler 24 may be implemented as a 90-degree parallel coupler of a phase shifter to obtain a 180-degree phase difference between the signal 42 and the signal 44. Also, the amplitudes of signals 42 and 44 are adjustable by the coupler 24. Thus, the coupler 24 is configured to generate a selectable and adjustable amplitude balance between the signals 42 and 44. The resultant error signal 46 includes only the distortion component of signal 42. Comparing the signals 46 and 36, the error signal 46 contains a distortion component and the signal 36 contains an amplified version of the input signal 30 (or replica signal 32) and a distortion component, wherein the distortion components of the signals 36 and 46 are approximate replica of each other, possibly differing in amplitude.

In another embodiment, the small signal amplifiers 20 and 22 are configured to have approximately the same operating parameters (e.g., biasing values), and the coupler 16 is configured to provide the signals 20 and 22 differing in amplitude. This may be accomplished by implementing the coupler 16 as any appropriate device capable of adjusting the amplitudes of signals 38 and 40. In one embodiment, coupler 16 is a 90-degree parallel coupler having amplitude adjustment capability. The resultant difference in amplitude between signals 38 and 40 is large enough to cause one of the auxiliary amplifiers 20 and 22 to operate in its linear region and to cause the other of the auxiliary amplifiers 20 and 22 to operate in its nonlinear region.

The coupler 28 subtracts the error signal 46 from the signal 36 produced by the power amplifier 14, and produces an approximately distortionless signal 50 having the amplified version of the selected input signal (30 or 32) and a minimal, or no, distortion component. Optionally, the amplitude of the error signal 46 is adjusted to be approximately equal to the amplitude of the distortion component of the signal 36 by amplitude/phase adjuster 26. Also, the phase of the error signal 46 may be adjusted to ensure cancellation of the distortion component from the signal 36 when it is combined with the signal 48. Amplitude/phase adjuster 26 provides the signal 48 having its amplitude being approximately equal to the amplitude of the distortion component of the signal 36.

Figure 2:
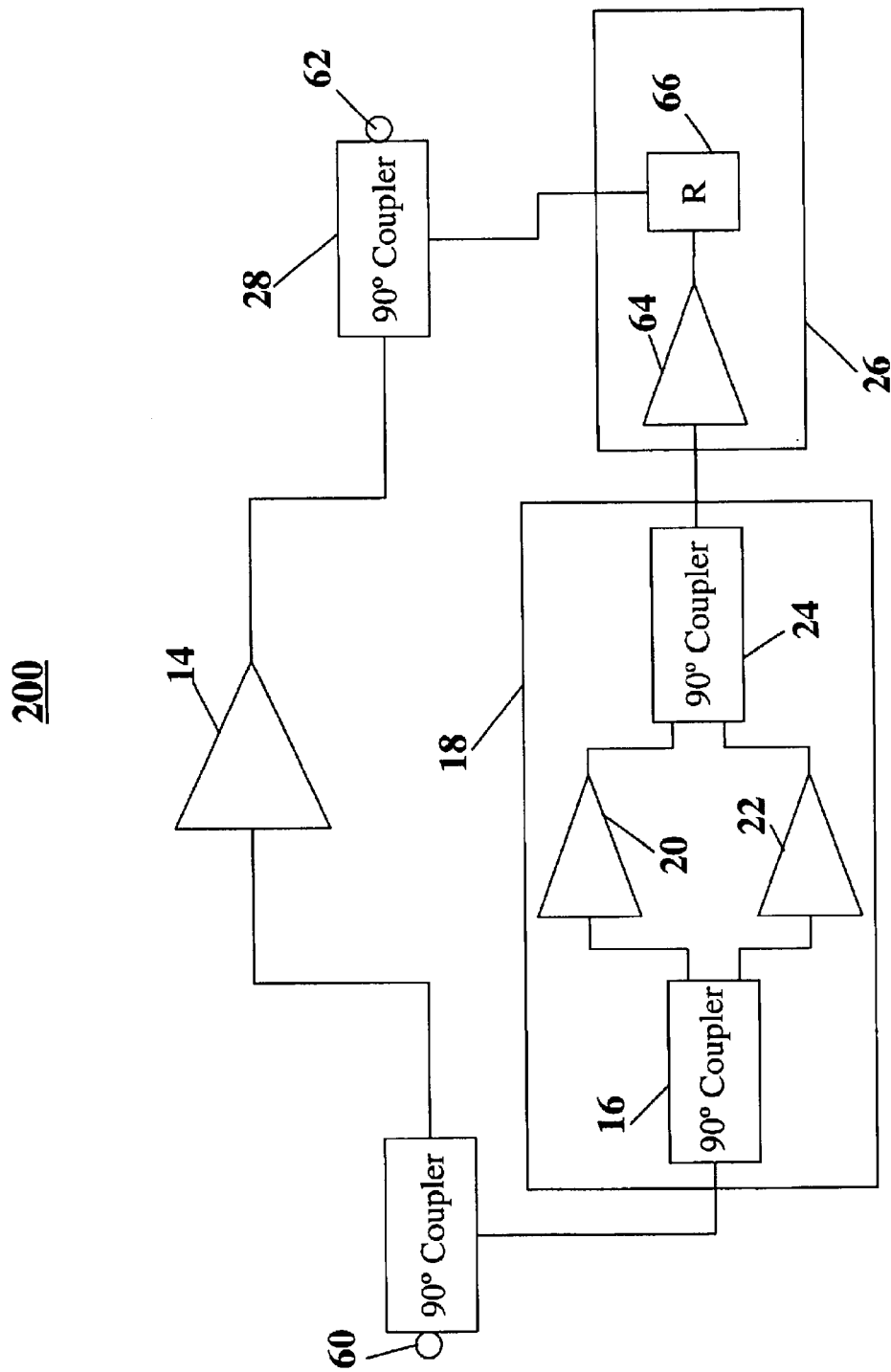
FIG. 2 is a circuit diagram of an exemplary circuit for reducing power amplifier distortion in accordance with the present invention.

In FIG. 2 is shown a circuit diagram of an exemplary circuit 200 for reducing power amplifier distortion in accordance with the present invention. It is emphasized that circuit 200 and depicted values are exemplary. Other values and circuit configurations may readily occur to those skilled in the art. In FIG. 2, the splitter 12 is configured as a 90-degree parallel coupler electromagnetically coupled to input terminal 60. The input terminal 60 may be used to receive an input signal. The splitter 12 is also electromagnetically coupled to the power amplifier 14 and the error generator portion 18. In one exemplary embodiment, the error generator portion 18 comprises the coupler 16 configured as a 90-degree parallel coupler electromagnetically coupled to each of auxiliary amplifiers 20 and 22. Each of the auxiliary amplifiers 20 and 22 is electromagnetically coupled to the coupler 24, which is configured as a 90-degree parallel coupler. The error generator portion 18 is electromagnetically coupled to the amplitude/phase adjuster 26. In an exemplary embodiment, the amplitude/phase adjuster 26 comprises an amplifier 64 and a resistance, implemented as the attenuator 66, for adjusting the amplitude and/or phase of a signal received by the amplitude/phase adjuster 26. The amplitude/phase adjuster 26 is electromagnetically coupled to the coupler 28, which is configured as a 90-degree coupler and is electromagnetically coupled to the power amplifier 14 and an output terminal 62. The output terminal 62 may be used to provide an output signal.

Figure 3:
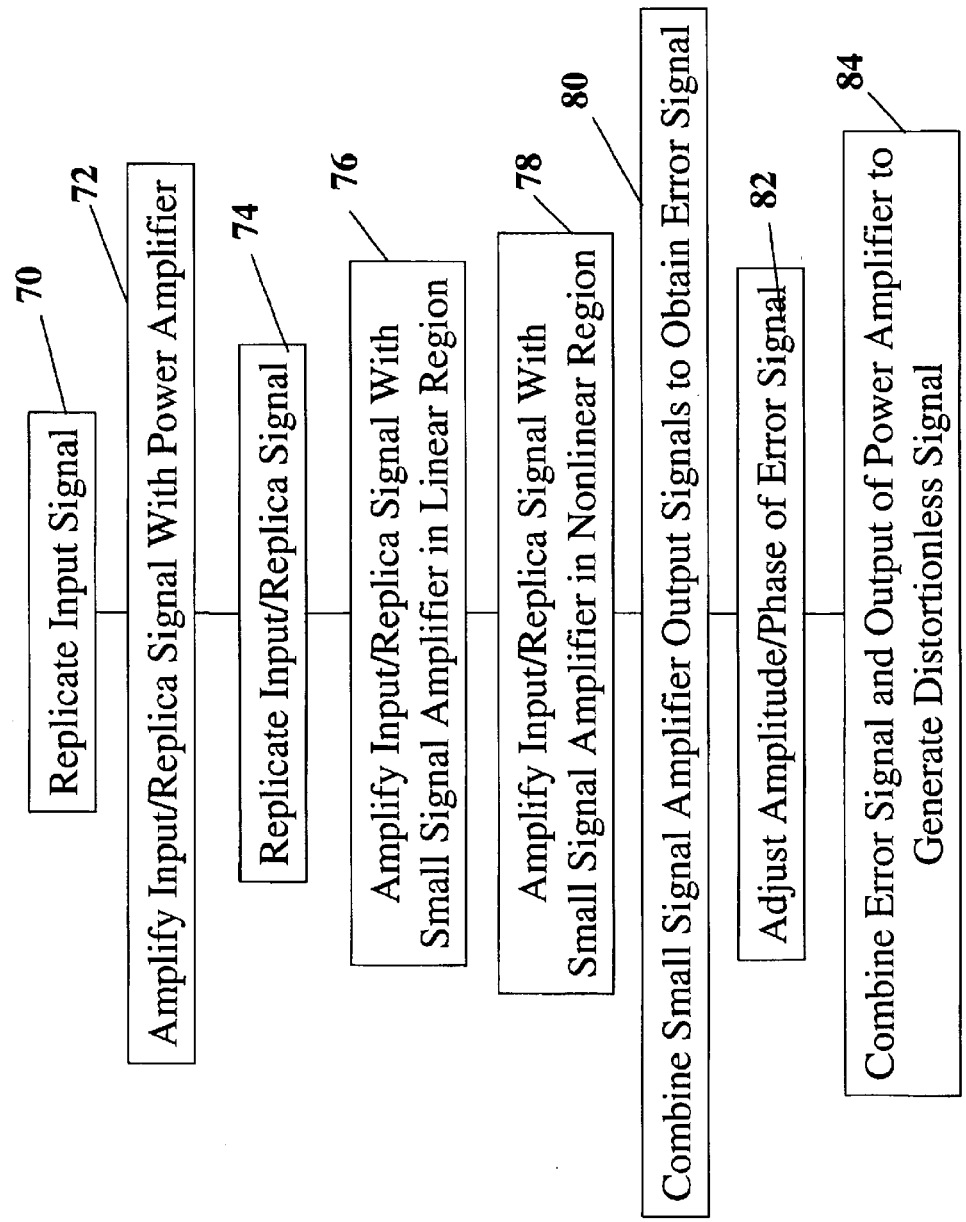
FIG. 3 is a flow diagram of an exemplary process for reducing power amplifier distortion, in accordance with the present invention.

FIG. 3 is a flow diagram of an exemplary process for reducing power amplifier distortion. Please refer to the functional block diagram shown in FIG. 1 to aid in the description of the flow diagram shown in FIG. 3. The components of FIG. 1 will be used as examples to aid in understanding the flow diagram of FIG. 3. At step 70, the input signal (e.g., signal 30) is replicated to provide at least one replica signal (e.g., replica signals 32 and 34). As previously described, this replication step 70 is optional. The input signal, or replica signal (e.g., the signals 30, 32) is amplified by a power amplifier (e.g., amplifier 14) at step 72. At step 74 one of the input signal (e.g., signal 30) or a replica signal (e.g., signal 34) is replicated (e.g., by coupler 16). One of these replicated signals (e.g., signals 38 or 40) is amplified at step 76 by a small signal small signal amplifier (e.g., one of amplifiers 20 or 22) in its linear region of operation. This linear amplifier provides a signal having no, or minimal, distortion. At step 78, the other of the replicated signals (e.g., the other of signals 38 or 40) is amplified by another small signal amplifier in its nonlinear region of operation. This nonlinear amplifier provides a signal comprising a distortion component. The signals (e.g., signals 42 and 44) provided by the small signal amplifiers (e.g., auxiliary amplifiers 20 and 22) are combined at step 80 to obtain an error signal (e.g., error signal 46) containing a distortion component. The amplitude and/or phase of the error signal is optionally adjusted at step 82 (e.g., by amplitude/phase adjuster 26) to make the amplitude of the error signal be approximately equal to the amplitude of the distortion component of the signal provided by the power amplifier and to adjust the phase of the signal 46 such that when the signal 48 is combined with signal 36, the distortion component is cancelled. The adjusted error signal and the signal provided by the power amplifier are combined (e.g., by coupler 28) at step 84 to subtract out the distortion component and provide an output signal comprising an amplified version of the input signal (e.g., signal 30) and no, or minimal, distortion produced by the power amplifier.

The linearization scheme for reducing power amplifier distortion as presented herein, does not utilize delay lines to implement phase inversion. Delay lines limit frequency bandwidth. The delay accuracy of delay lines also tends to drift with temperature. The linearization scheme as presented herein does not exhibit temperature instability. Also, it is operable at much greater bandwidths, than achievable by feed forward utilizing delay lines. For example, the scheme presented herein is operable at over a bandwidth range of 7.1 GHz to 7.7 GHz. Furthermore, acceptable performance is achievable operating the power amplifier in either class A or class B operation.

Because numerous modifications and changes to the embodiments described above will readily occur to those of ordinary skill in the art, it is not desired to limit the invention to the exact construction and operation illustrated and described. Accordingly, all suitable modifications and equivalents should be considered as falling within the spirit and scope of the invention.

What is claimed is:

1. An apparatus for reducing amplifier distortion, said apparatus comprising:
    an amplifying portion configured to:
        receive one of an input signal and a replica signal being an approximate replica of said input signal; and
        provide an amplifier signal comprising an amplifier distortion component;
    an error generator portion configured to:
        receive one of said input signal and said replica signal;
        amplify the one of said input signal and said replica signal; and
        provide an error signal comprising an error signal distortion component being an approximate replica of said amplifier distortion component; and
    a combining portion configured to:
        subtract said error signal from said amplifier signal.

2. An apparatus in accordance with claim 1, further comprising:
    a replicating portion configured to:
        receive said input signal; and
        provide at least one of said replica signal.

3. An apparatus in accordance with claim 1, further comprising:
    an adjustment portion configured to adjust at least one of:
        an amplitude of said error signal distortion component to be approximately equal to an amplitude of said amplifier distortion component; and
        a phase of said error signal.

4. An apparatus for reducing amplifier distortion, said apparatus comprising:
    an amplifying portion configured to:
        receive one of an input signal and a replica signal being an approximate replica of said input signal; and
        provide an amplifier signal comprising an amplifier distortion component;
    an error generator portion configured to:
        receive one of said input signal and said replica signal; and
        provide an error signal comprising an error signal distortion component being an approximate replica of said amplifier distortion component; and
    a combining portion configured to subtract said error signal from said amplifier signal;
    said error generator portion comprising:
        a first auxiliary amplifier; and
        a second auxiliary amplifier, wherein:
            one of said first and second auxiliary amplifiers is configured to provide a signal comprising said error signal distortion component; and
            the other of said first and second auxiliary amplifiers is configured to provide an approximately distortionless signal; and
            an error combining portion configured to combine said signals provided by said first and second auxiliary amplifiers; and, provide said error signal.

5. An apparatus in accordance with claim 4, wherein:
    one of said first and second auxiliary amplifiers is operated in a nonlinear region for providing said error signal distortion component; and
    the other of said first and second auxiliary amplifier is operated in a linear region for providing said approximately distortionless component.

6. An apparatus in accordance with claim 4, said error generator portion further comprising:

a coupler configured to:
  receive one of said input signal and said replica signal; and
  provide a first intermediate signal to one of said first and second auxiliary amplifiers and provide a second intermediate signal to the other of said first and second auxiliary amplifiers, wherein:
    said first and second intermediate signals differ in amplitude;
    one of said first and second intermediate signals having a greater amplitude causes a respective auxiliary amplifier to operate in a nonlinear region for providing said error signal distortion component; and
    the other one of said first and second intermediate signals having a lesser amplitude causes a respective auxiliary amplifier to operate in a linear region for providing said approximately distortionless component.

7. An apparatus in accordance with claim 4, wherein said amplifying portion, said first auxiliary amplifier, and said second auxiliary amplifier have approximately identical distortion characteristics.

8. An apparatus in accordance with claim 4, wherein said amplifying portion, said first auxiliary amplifier, and said second auxiliary amplifier are configured from a common integrated circuit to have approximately identical distortion characteristics.

9. An apparatus in accordance with claim 4, wherein said amplifying portion comprises an amplifier configured as a power amplifier and said first and second auxiliary amplifiers are configured as small signal amplifiers.

10. An apparatus in accordance with claim 4, wherein said error combining portion comprises a 90-degree parallel coupler.

11. A method for reducing amplifier distortion, said method comprising:
  amplifying one of an input signal and an approximate replica of said input signal for generating a first signal comprising an amplifier distortion component;
  amplifying one of said input signal and said approximate replica of said input signal for generating a second signal comprising an approximate replica of said amplifier distortion component;
  amplifying one of said input signal and said approximate replica of said input signal for generating an approximately distortionless third signal;
  combining said second and third signals for generating a fourth signal indicative of a difference between said second and third signals;
  combining said first and fourth signals for subtracting said amplifier distortion component from said first signal.

12. A method in accordance with claim 11, further comprising:
  replicating said input signal for generating at least one replica of said input signal.

13. A method in accordance with claim 11, further comprising:
  adjusting at least one of:
    an amplitude of said fourth signal to be approximately equal to an amplitude of said amplifier distortion component of said first signal; and
    a phase of said fourth signal.

14. A method in accordance with claim 11, wherein said step of generating said second signal comprises nonlinearly amplifying one of said input signal and said approximate replica of said input signal.

15. A method in accordance with claim 11, wherein said step of generating said third signal comprises linearly amplifying one of said input signal and said approximate replica of said input signal.

16. A method in accordance with claim 11, further comprising:
  replicating one of said input signal and said approximate replica of said input signal for generating a sixth signal and a seventh signal, wherein;
    said sixth and seventh signals differ in amplitude;
    one of said sixth and seventh signals having a greater amplitude is amplified to generate said second signal; and
    the other one of said sixth and seventh signals having a lesser amplitude is amplified to generate said third signal.

17. An amplifier circuit comprising:
  a first amplifier electromagnetically coupled to an input terminal and a first coupler;
  said first coupler electromagnetically coupled to an output terminal;
  a second amplifier electromagnetically coupled to said input terminal and a second coupler;
  a third amplifier electromagnetically coupled to said input terminal and said second coupler;
  an amplitude/phase adjustment circuit electromagnetically coupled to said second coupler and said first coupler; and
  said second coupler electromagnetically coupled to said first coupler.

18. A circuit in accordance with claim 17, further comprising:
  a third coupler electromagnetically coupled to said input terminal, said second amplifier, and said third amplifier.

19. A circuit in accordance with claim 17, wherein said second coupler comprises a 90-degree parallel coupler.

* * * * *